United States Patent [19]

Guckel

[11] Patent Number: 5,190,637
[45] Date of Patent: Mar. 2, 1993

[54] FORMATION OF MICROSTRUCTURES BY MULTIPLE LEVEL DEEP X-RAY LITHOGRAPHY WITH SACRIFICIAL METAL LAYERS

[75] Inventor: Henry Guckel, Madison, Wis.

[73] Assignee: Wisconsin Alumni Research Foundation, Madison, Wis.

[21] Appl. No.: 874,116

[22] Filed: Apr. 24, 1992

[51] Int. Cl.⁵ ............................................. C25D 5/02
[52] U.S. Cl. ................................... 205/118; 205/125
[58] Field of Search .............................. 205/118, 123

[56] References Cited

U.S. PATENT DOCUMENTS

| | | |
|---|---|---|
| 3,449,221 | 6/1969 | Thomas . |
| 3,535,137 | 10/1970 | Haller et al. . |
| 3,886,584 | 5/1975 | Cook, Jr. et al. . |
| 3,984,582 | 10/1976 | Feder et al. . |
| 4,018,938 | 4/1977 | Feder et al. . |
| 4,035,522 | 7/1977 | Hatzakis . |
| 4,107,351 | 8/1978 | James et al. . |
| 4,351,653 | 9/1982 | Becker et al. . |
| 4,422,905 | 12/1983 | Becker et al. . |
| 4,493,753 | 1/1985 | Becker et al. . |
| 4,541,977 | 9/1985 | Becker et al. . |
| 4,563,250 | 1/1986 | Becker et al. . |
| 4,563,251 | 1/1986 | Becker et al. . |
| 4,661,212 | 4/1987 | Ehrfeld et al. . |
| 4,693,791 | 9/1987 | Becker et al. . |
| 4,694,548 | 9/1987 | Ehrfeld et al. . |
| 4,698,285 | 10/1987 | Ehrfeld et al. . |
| 4,703,559 | 11/1987 | Ehrfeld et al. . |
| 4,705,605 | 11/1987 | Becker et al. . |
| 4,738,010 | 4/1988 | Ehrfeld et al. . |
| 4,780,382 | 10/1988 | Stengl et al. . |
| 4,784,935 | 11/1988 | Ehrfeld et al. . |
| 4,797,211 | 1/1989 | Ehrfeld et al. . |
| 4,872,888 | 10/1989 | Ehrfeld et al. . |

OTHER PUBLICATIONS

Brochure (in German) "Die LIGA Technik", by MicroParts, Gesellschaft, 1990.
E. W. Becker, et al., "Fabrication on Microstructures with High Aspect Ratios and Great Structural Heights by Synchrotron Radiation Lithography Galvanoforming, and Plastic Moulding (LIGA process)", Microelectronic Engineering, vol. 4, No. 1, May 1986, pp. 35-36.
W. Ehrfeld, et al., "Fabrication of Microstructures Using the LIGA Process", Proc. IEEE Micro Robots and Teleoperators Workshop, Nov. 9-11, 1987, pp. 1-11.
P. Hagmann, et al., "Fabrication of Microstructures of Extreme Structural Heights by Reaction Injection Moulding", International Polymer Processing IV, 1989, pp. 188-195.

(List continued on next page.)

Primary Examiner—T. M. Tufariello
Attorney, Agent, or Firm—Foley & Lardner

[57] ABSTRACT

Complex metal structures are formed in microminiature dimensions utilizing multiple mask exposures which are capable of producing substantially arbitrary three-dimensional shapes. A first layer of a primary metal is electroplated onto an exposed plating base to fill a void in a photoresist, the photoresist is removed, and a secondary metal, which can constitute a sacrificial metal, is electroplated over the first layer and the plating base. The exposed surface of the deposited secondary metal is then machined down to a height which exposes the first metal to produce a substantially flat, uniform surface extending across both the primary and secondary metals. The secondary metal facilitates machining of the primary and secondary metals because of these mechanical stability provided by the secondary metal to the primary metal. After the first layers of the primary and secondary metals have been machined, another photoresist layer can be applied over the primary and secondary metals, and a second layer of primary metal is electroplated. A further layer of secondary metal can be also electroplated if desired. The process of machining and electroplating can be repeated until the desired structure is formed. Secondary metal is removed by an etchant which does not etch the primary metal.

21 Claims, 10 Drawing Sheets

OTHER PUBLICATIONS

W. Ehrfeld, et al., "Microfabrication of Sensors and Actuators for Microrobots," Proc. IEEE International Workshop on Intelligent Robots and Systems, Tokyo, Japan, Oct. 31–Nov. 2, 1988, pp. 3–7.

W. Ehrfeld, "Three Dimensional Microfabrication Using Synchrotron Radiation," International Symposium on X-Ray Synchrotron Radiation and Advances Science and Technology, Feb. 15–16, 1990, pp. 121–141.

W. Ehrfeld, et al., "LIGA Process: Sensor Construction Techniques Via X-Ray Lithography," Technical Digest, IEEE Solid State Sensor and Actuator Workshop, 1988, pp. 1–14.

H. Guckel, et al., "Deep X-Ray and UV Lithographies for Micromechanics", Technical Digest, IEEE Solid State Sensor and Actuator Workshop, Hilton Head, S.C., Jun. 4–7, 1990, pp. 118–122.

H. Guckel, et al., "Microstructure Sensors," International Election Devices Meeting (IEDM), San Francisco, Calif., Dec., 1990.

H. Guckel, et al., "Fabrication of Assembled Micromechanical Components via Deep X-Ray Lithography", Proceedings of IEEE Micro Electro Mechanical Systems (MEMS) 1991, Nara, Japan, 30 Jan.–2 Feb., 1991.

W. Meny, et al., "The LIGA Technique—a Novel Concept for Microstructures and the Combination with Si-Technologies by Injection Molding", Proceedings of IEE Micro Electro Mechanical Systems (MEMS) 1991, Nara, Japan, Jan. 30–Feb. 2, 1991, pp. 69–73.

PiRL: Polyimide Release Layer, brochure from Brewer Science, Inc.

Roger T. Howe, et al., "Silicon Micromechanics: Sensors and Actuators on a Chip", IEEE Spectrum, Jul., 1990, pp. 29–35.

J. Mohr, et al., "Fabrication of Microsensor and Microactuator Elements by the LIGA-Process," Proceedings of Transducers '91, San Francisco, Calif., Jun. 24–27, 1991, pp. 607–609.

H. Guckel, et al., "Fabrication and Testing of the Planar Magnetic Micromotor," Journal of Micromechanics and Microengineering, IOP Publishing, England, vol. 1, No. 3, Dec. 1991.

H. Guckel, "Silicon Microsensors: Construction, Design and Performance," European Solid State Conference, Montreux, Switzerland, Sep. 1991, pp. 387–398.

H. Guckel, "On The Application of Deep X-Ray Lithography and Metal Plating to Micromechanics and Micromagnetics," The Second International Symposium on MicroMachine and Human Science, Nagoya, Japan, Oct. 8 and 9, 1991.

H. Guckel, et al., "On The Application of Deep X-Ray Lithography With Sacrifical Layers to Sensor and Actuator Construction (the Magnetic Micromotor With Power Takeoffs)," Proceedings '91 of Transducers '91, San Francisco, Calif.

FORMATION OF MICROSTRUCTURES BY MULTIPLE LEVEL DEEP X-RAY LITHOGRAPHY WITH SACRIFICIAL METAL LAYERS

This invention was made with United States government support awarded by the National Science Foundation (NSF) Grant No. EET-8815285. The United States Government has certain rights in this invention.

FIELD OF THE INVENTION

This invention pertains generally to the field of semiconductor and micromechanical devices and processing techniques therefor, and particularly to the formation of microminiature structures formed of metal.

BACKGROUND OF THE INVENTION

Deep X-ray lithography involves a substrate which is covered by thick photoresist, typically severally hundred microns in thickness, which is exposed through a mask by X-rays. X-ray photons are much more energetic than optical photons, which makes complete exposure of thick photoresist films feasible and practical. Furthermore, since X-ray photons are short wavelength particles, diffraction effects which typically limit device dimensions to two or three wavelengths of the exposing radiation are absent for mask dimensions above 0.1 micron. If one adds to this the fact that X-ray photons are absorbed by atomic processes, standing wave problems, which typically limit exposures of thick photoresist by optical means, become an non-issue for X-ray exposures. The use of a synchrotron for the X-ray source yields high flux densities—several watts per square centimeter—combined with excellent collimation to produce thick photoresist exposures without any horizontal run-out. Locally exposed patterns should therefore produce vertical photoresist walls if a developing system with very high selectivity between exposed and unexposed photoresist is available. This requirement is satisfied for polymethylmethacrylate (PMMA) as the X-ray photoresist and an aqueous developing system. See, H. Guckel, et al., "Deep X-Ray and UV Lithographies For Micromechanics", Technical Digest, Solid State Sensor and Actuator Workshop, Hilton Head, S.C., June 4-7, 1990, pp. 118-122.

Deep X-ray lithography may be combined with electroplating to form high aspect ratio structures. This requires that the substrate be furnished with a suitable plating base prior to photoresist application. Typically this involves a sputtered film of adhesive metal such as chromium or titanium which is followed by a thin film of the metal which is to be plated. Exposure through a suitable mask and development are followed by electroplating. This results, after cleanup, in fully attached metal structures with very high aspect ratios. Such structures were reported by W. Ehrfeld and co-workers at the Institute for Nuclear Physics at the University of Karlsruhe in West Germany. Ehrfeld termed the process "LIGA" based on the first letters of the German words for lithography and electro-plating. A general review of the LIGA process is given in the article by W. Ehrfeld, et al., "LIGA Process: Sensor Construction Techniques Via X-Ray Lithography", Technical Digest, IEEE Solid-State Sensor and Actuator Workshop, 1988, pp. 1-4.

A difficulty with the original LIGA process is that it can only produce fully attached metal structures. This restricts the possible application areas severely and unnecessarily.

The addition of a sacrificial layer to the LIGA process facilitates the fabrication of fully attached, partially attached, or completely free metal structures. Because device thicknesses are typically larger than 10 microns and smaller than 300 microns, freestanding structures will not distort geometrically if reasonable strain control for the plated film is achieved. This fact makes assembly in micromechanics possible and thereby leads to nearly arbitrary three-dimensional structures. See H. Guckel, et al., "Fabrication of Assembled Micromechanical Components via Deep X-Ray Lithography," Proceedings of IEEE Micro Electro Mechanical Systems, January 30-Feb. 2. 1991, pp. 74-79. In principal, it is possible to extend the LIGA process with or without a sacrificial layer by performing several X-ray exposures of photoresist, with electroplating of additional layers of metal after each exposure. However, the extension of the conventional LIGA process encounters topological as well as practical difficulties. The topological problem derives from the fact that electrical contact must be established to the plating base during electroplating. Since the X-ray photoresist is an insulator, electrical contact after X-ray exposure and development of the photoresist can only occur through the previously deposited metal structures which are themselves in contact with the underlying plating base. This implies that an acceptable second X-ray mask topology would have to contain features which are always fully contained within the features of the first mask. Thus, a shaft with steps of ever decreasing diameter could be constructed. However, a shaft having an initial small diameter with a second layer expanding into a larger diameter or into a gear is not possible. The second problem involves the practicality of the process. Exposing and developing the X-ray photoresist and then electroplating produces cracking and crazing of the photoresist. Although it is possible that damage to the photoresist can be partially cured by applying a second photoresist layer, additional layers of photoresist tend to increase photoresist strain and cause geometric deformation of the photoresist.

SUMMARY OF THE INVENTION

In accordance with the present invention, complex metal structures can be formed in microminiature dimensions utilizing multiple mask exposures which allow substantially arbitrary three dimensional shapes to be formed. These shapes include structures, formed on a substrate, having overhanging portions and tubular structures which can be utilized for hydraulic and pneumatic applications, and parts which are formed on a sacrifical layer to allow complete removal of the parts from the substrate for subsequent assembly. The process is particularly well suited to deep X-ray lithography in which metal structures are formed by X-ray exposure of a relatively thick photoresist and electroplating of metal into the area from which the exposed photoresist is removed, resulting in structures having extremely well defined vertical walls formed to significant height, e.g., 100 to 300 micrometers in thickness.

In carrying out the process of the invention, a plating base is initially applied to a substrate, or in appropriate cases, a metal substrate itself may function as a plating base. Where the formed part is later to be partially or wholly removed from the substrate, the plating base is applied over an initial sacrificial layer on the substrate. Photoresist is then cast onto the plating base, and the photoresist is exposed in a pattern, such as from an exposure through an X-ray mask to synchrotron radiation, and the exposed photoresist is removed. A first layer of a primary metal is then electroplated onto the exposed plating base to fill the area defined by the void in the photoresist. The remaining photoresist is then removed and a secondary metal, which can constitute a sacrificial metal, is then electroplated over the previously deposited first layer of primary metal and the plating base. Where the secondary metal is to be utilized as a sacrificial metal, it is selected so that it will be differentially etched by a selected etchent which does not substantially attack the primary metal. The exposed surface of the deposited secondary metal is then machined down to a height which exposes the first metal. The machining, e.g., mechanical grinding or milling, achieves a substantially flat, uniform surface extending across both the primary and secondary metals, and allows the thickness of the first layer of primary metal to be closely controlled, and particularly allows the exposed surface of the primary metal to be formed substantially smooth. In contrast, an electroplated metal by itself before machining shows an uneven surface which is not well controlled in thickness. Moreover, a smooth surface for the first layer of the primary metal is better suited to receive an electroplated second layer thereon than the rough surface of an as-plated metal.

The utilization of the secondary or sacrificial metal to completely cover the first layer of the primary metal facilitates machining of the surface of both the primary and secondary metals allowing the surface of the primary metal to be reduced to a desired height, because of the mechanical stability which the secondary metal affords to the primary metal which it surrounds and supports. In contrast, such mechanical machining is difficult or impossible where a polymer photoresist remains adjacent the primary metal; machining generally cannot be done through both the photoresist and the primary metal since the photoresist is relatively weak mechanically and will shred and tear as it is being milled, and the photoresist is not strong enough to provide horizontal support to the relatively small and potentially fragile primary metal structures. Similarly, if the photoresist were removed and machining of the now isolated primary metal structures were attempted, such machining would be extremely difficult and would risk substantial damage such as ripping off portions of the primary metal structure from the substrate.

After the first layer of the primary and secondary metals have been machined down to the desired level, a secondary photoresist layer may be applied over both the primary and secondary metal, and then the photoresist may be exposed to X-rays in a desired pattern which may result in photoresist covering at least part of the primary metal and extending out over the secondary metal. The exposed photoresist is then removed and a second layer of primary metal, generally but not necessarily the same metal as the first layer of primary metal, is electroplated in the area of the removed photoresist covering at least in part the first layer of primary metal, but also covering part of the first layer of secondary metal. Because both the primary and secondary metals are conductors of electricity, electroplating can occur over both of these materials. The photoresist is then removed. At this point, if only two layers are desired, the secondary metal can be removed with an etchant which differentially etches the secondary metal and not the primary metal to leave the isolated two layer primary metal structure on the substrate. If this structure is to be freed from the substrate, the plating base is then patterned and removed around the structure and the sacrificial layer under the plating base is then dissolved to free the structure.

Alternatively, the first layer of secondary metal may be left in place and a second layer of secondary metal deposited over both the second layer of the primary metal and the first layer of the secondary metal. After electroplating, the exposed surface may then be machined down to reduce the overall height of the multi-layer structure to a desired level and to expose the second layer of the primary metal. At this point, the process described above can be repeated, i.e., casting of the photoresist, exposure of the photoresist, removal of the exposed photoresist, and deposit of the third layer of the primary metal. The process can be repeated for as many layers as appropriate.

Complex structures, such as hollow tubes and bridge structures, can be readily formed by having the second layer of the primary metal bridge a secondary metal between two or more structures formed of the first layer of the primary metal.

Further objects, features and advantages of the invention will be apparent from the following detailed description when taken in conjunction with the accompanying drawings.

DETAILED DESCRIPTION OF THE INVENTION

In the present invention, microstructures can be formed on a variety of substrates, including silicon, germanium, metals, ceramic, glass, and so forth. Such substrates can include semiconductor substrates on which electronic devices have been formed utilizing conventional planar processes. Although the present invention utilizes deep exposures of a photoresist to radiation, such as by X-ray exposure with synchrotron radiation, portions of the substrate on which no structures are to be formed can be masked off so that they are not exposed to substantial radiation. Moreover, minor radiation damage can be annealed out after exposure. Thus, the present process is compatible with microelectronic manufacture, allowing for the integration of mechanical structures onto microelectronic semiconductor substrates.

Figure 1:
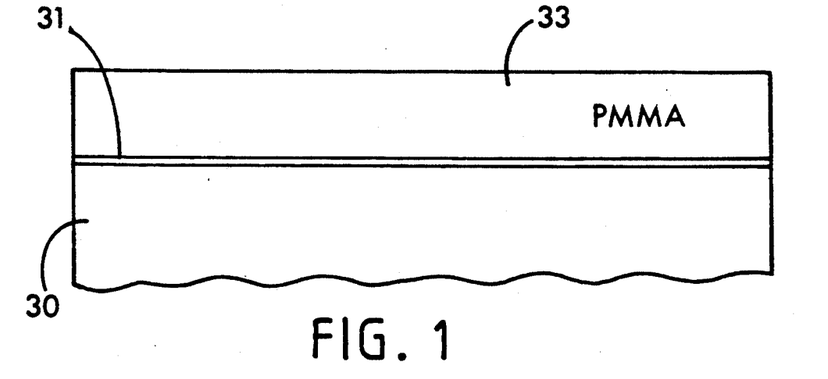
FIGS. 1-9 are schematic views illustrating steps in the process of the invention for forming a multi-layer structure fixed to a substrate.
Figure 2:
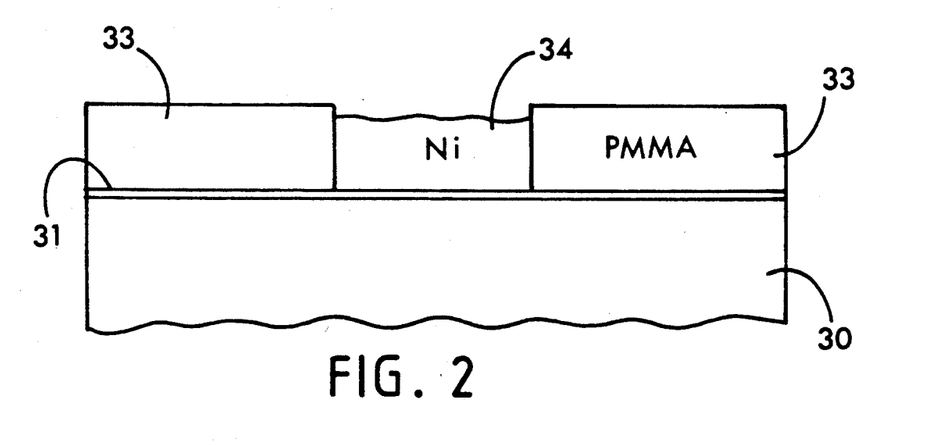
Figure 3:
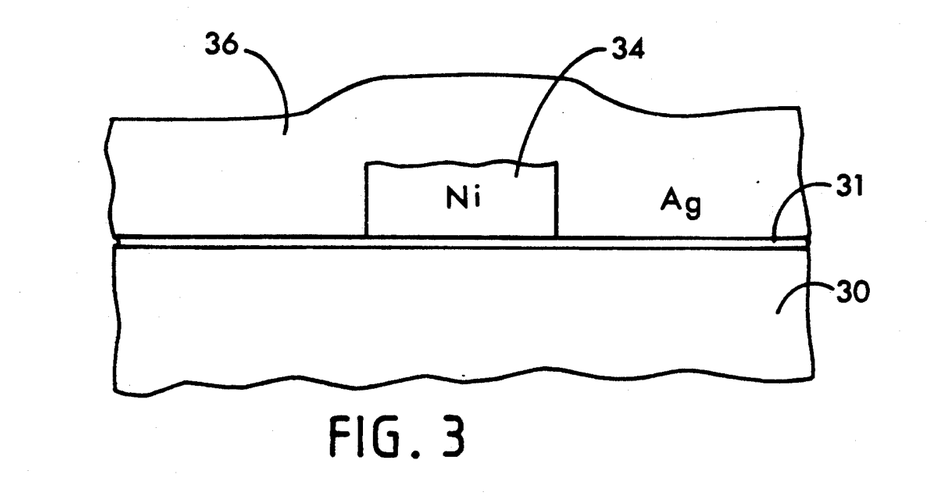
Figure 4:
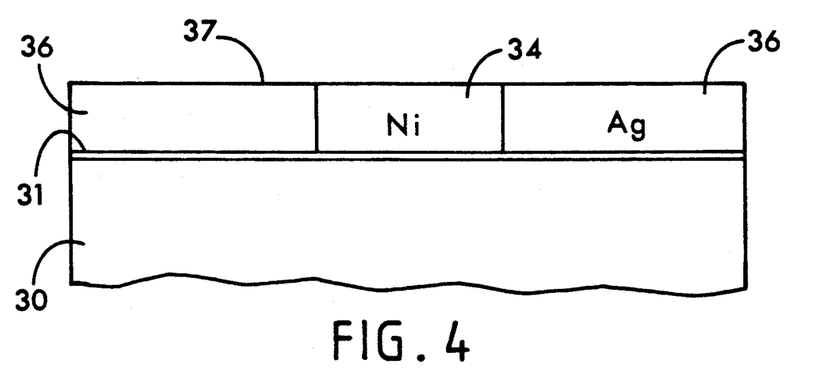

The basic process of the invention is illustrated with respect to the views of FIGS. 1-9. With reference to FIG. 1, the initial substrate 30 may, as noted above, comprise a variety of materials, including semiconductors, insulators and so forth. The substrate 30 could be composed of a conductive metal. In such a case, no plating base may be necessary. However, in general, a plating base 31 will be deposited onto the top surface of the substrate 30, such as by sputtering, and then the photoresist 33, for example, polymethylmethacrylate (PMMA), may be cast on to the desired thickness. The next step, as shown in FIG. 2, involves X-ray exposure and dissolving of the photoresist in a desired pattern, and the electroplating of a primary layer of a first metal 34, for example nickel. Depending on the type of radiation used, the depth of exposure, and the properties of available photoresists, it is apparent that positive or negative photoresists may be used. Next, as illustrated in FIG. 3, the photoresist 33 is removed, and a secondary metal 36 is electroplated over the first layer of the primary metal and onto the plating base 31 where it is exposed. As an example, where the primary metal is nickel, silver may be utilized as the secondary metal. Next, as shown in FIG. 4, the exposed surface is micromilled down until the primary metal 34 is exposed and a substantially uniform flat surface 37 is formed which extends over both the primary metal 34 and the secondary metal 36. At this point, the secondary metal 36 may be selectively removed by etching, thereby producing a single level structure with all surfaces being well defined. This removal may take place using an etchant which etches the secondary metal but not the primary metal. Because the secondary metal has similar mechanical properties to the primary metal, the secondary metal has provided a coherent structure with sufficient integrity to allow accurate machining, such as by milling.

Figure 5:
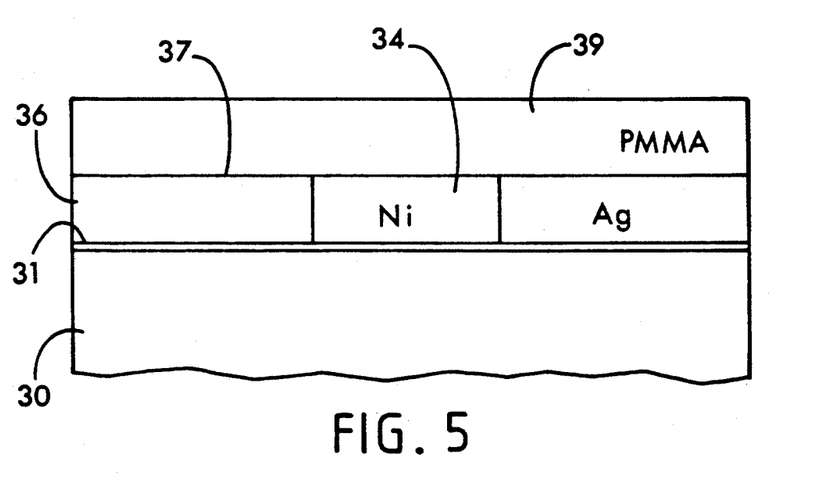
Figure 6:
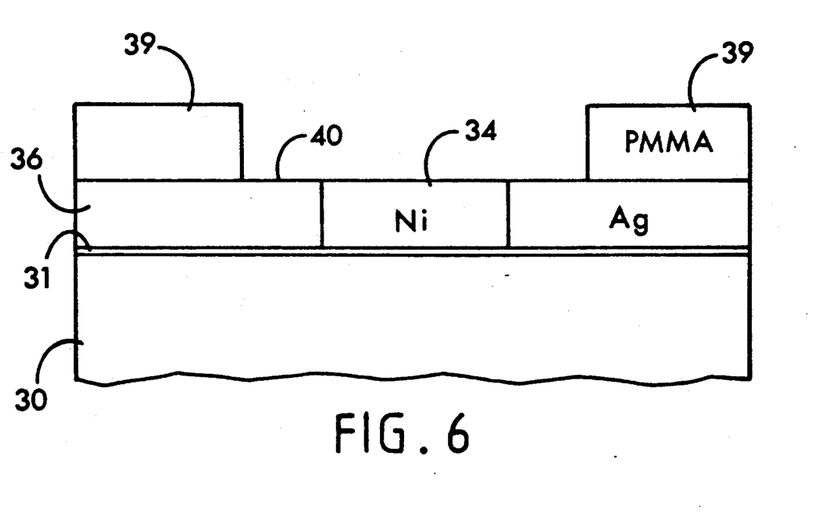
Figure 7:
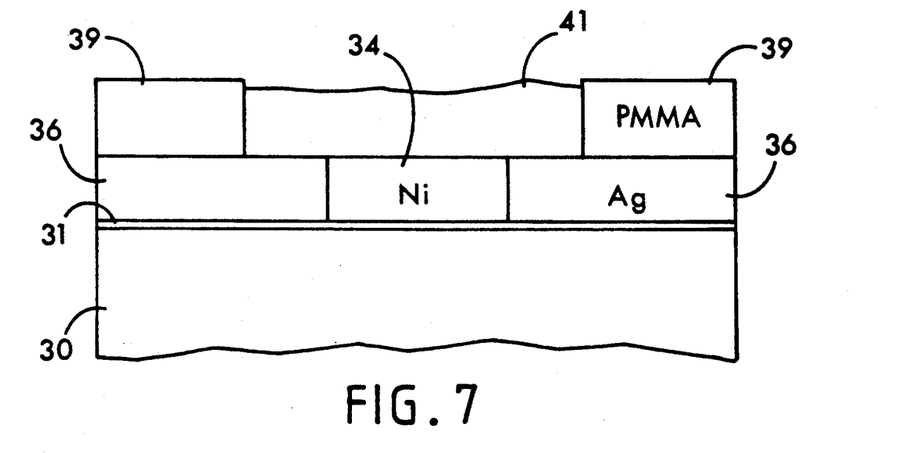

The process may continue with further layers, as illustrated in FIG. 5, wherein a second layer of photoresist 39 is cast over the surface 37 extending over the first layers of primary metal 34 and secondary metal 36. Next, as shown in FIG. 6, a second layer X-ray mask is aligned to the structure and an exposure is made with X-rays, such as in a synchrotron, and the photoresist is then developed to remove a portion of the photoresist to expose at least some if not all of the surface of the first layer of primary metal 34 as well as part of the surface of the first layer of secondary metal 36. As shown in FIG. 7, a second layer of primary metal 41 is then electroplated into the area 40 and covers at least some of the surface of the first layer of primary metal 34 as well as some of the surface of the first layer of secondary metal 36. The second layer of primary metal 41 may or may not be made of the same metal as the first layer 34.

Although exposure of the photoresist to radiation consisting of synchrotron X-rays is preferred to obtain structures of maximum depth and minimum run-out, it is apparent that the process may be used with other radiation, such as ultraviolet (UV) or non-synchrotron source X-rays where thinner structures are acceptable.

Figure 8:
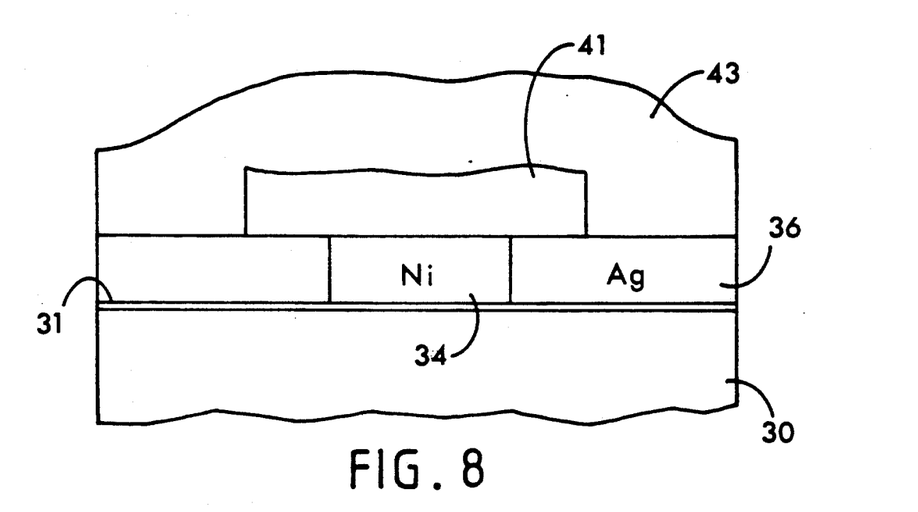
Figure 9:
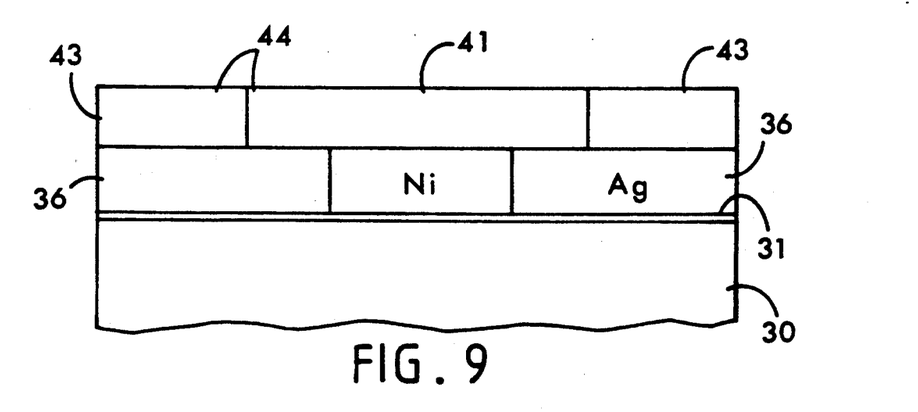
Figure 10:
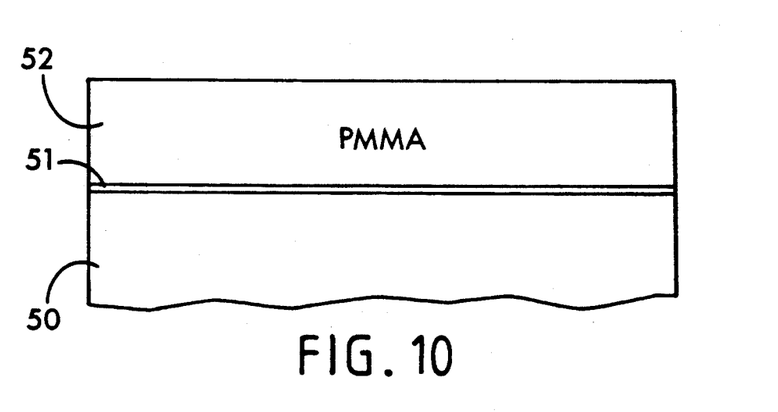
FIGS. 10-17 are schematic views illustrating steps in the process of the invention for forming a tubular structure fixed to a substrate.

As shown in FIG. 8, the photoresist 30 may then be removed and another layer 43 of the secondary or sacrificial metal may be electroplated to cover both the first layer 36 of the secondary metal and the second layer 41 of the primary metal. Then, as shown in FIG. 9, the exposed surface may be micromilled down to a selected height which exposes the second layer 41 of the primary metal and produces a substantially flat, uniform surface 44 across both the second layer 43 of the secondary metal and the second layer 41 of the primary metal. At this point, a planar surface has been recreated onto which subsequent layers may be formed. The secondary metal can then be removed at this time, if desired, which results in a three dimensional structure which has features, such as overhangs and projections, which are not obtainable with a single layer process.

Set forth below is an exemplary detailed process for carrying out the basic multilevel process of the invention as generally described above.

(1) Starting with substrate material of silicon, glass, metals, or silicon with protected processed semiconductor devices:
  (a) Sputter plating base: ~150 Å Ti, and ~300 Å Ni, both sputtered at 160° C.;
  (b) Apply adhesion promoter for cast PMMA:
    this solution is mixed fresh 4 hours prior to application:
      95±1 ml MeOH
      5±0.1 ml DI Water
      0.10±0.01 ml TMPMA
      (3-(Trimethoxysilyl) propyl methacrylate)
    flood surface of substrate; spin at 2 krpm for 40 sec.; follow with spin coat of 496K, 9% PMMA spun at 5 krpm for 60 sec.;
    anneal in a programmable oven under nitrogen:
      60° C./hour ramp to 180° C., hold for 1 hour at 180° C.,
      −60° C./hour ramp down to room temperature;
  (c) Cast PMMA
    Casting is performed using two premixed solutions:
    Solution I:
      35 wt. % PMMA—medium molecular weight —Aldrich #18,224-9,
      61 wt. % MMA—methymethacrylate—Aldrich #M5,590-9
      2 wt. % EGDA—Ethylene glycol dimethacrylate—Aldrich #33,568-1
      2 wt. % DMA—N,N-Dimethylaniline—Aldrich #D14,575-0
    Solution II:
      35 wt. % PMMA
      62 wt. % MMA
      2 wt. % EGDA
      1 wt. % BPO—Benzoyl peroxide—Aldrich #17,998-1
    The inhibitor in the MMA is removed using a disposable inhibitor removing column (Aldrich #30,631-2). The 35 wt.% PMMA must first be dissolved in the MMA (~1 week).
    Solutions I and II are mixed just prior to casting using a vacuum-mixer. A selected amount of the PMMA syrup is applied to the substrate wafer which is then put in a casting fixture to press the PMMA to the desired thickness. The samples remain under clamping for 48 hours and then are annealed in a programmable oven under 2 lpm N$_2$ as follows:
      20° C./hour ramp to 110° C., hold for 1 hour at 110° C.
      −5° C./hour ramp down to room temperature.
(2)
  (a) Assemble substrate and x-ray mask containing first layer pattern into suitable X-ray exposure jig;
  (b) Transport to synchrotron and X-ray expose under the following conditions (example is for Aladdin synchrotron at the University of Wisconsin)
    exposure chamber filled with 20 Torr He
    Be filter of ~250 μm
    typical exposure for a 100 μm film:
      ≧2500 mJ/sq. cm. using a flux constant of 0.0095 mW/sq.cm.
    typical scan is 2.0 cm at 0.05 cm/sec.
  (c) Deep UV expose edge of sample with linear spun-on PMMA for contact opening to plating base (~5 min. at 3.25 mW/sq.cm.)
  (d) Develop with EO developer:
    The development sequence includes a developer bath and two rinse baths and consists of:

developer:
  60% vol. 2-(2-Butoxyethoxy) ethanol
  20% vol. Tetrahydo -1 -4 Oxazin (Morpholine)
  5% 2-Aminoethanl (Ethanolamine)
  15% DI water
first rinse:
  80% 2-(2-Butoxyehtoxy) ethanol
  20% Water
second rinse:
  100% Water The development sequence for 100 μm PMMA is:
  a) develop in developer bath at 35.0±0.5° C. for 25 minutes with agitation
  b) rinse in first rinse bath at 35.0±0.5° C. for 20 minutes with agitation
  c) rinse in second rinse bath at 35.0±0.5° C. for 5 minutes with agitation
  (e) Prepare substrate for electroplating:
    oxygen plasma descum (parameters for a Plasma Therm 1441 for example: 25 sccm oxygen, p=20 mT above baseline, power=50 W, time=2 min).
    5% HCl treatment: dip for 15 min.
    30 sec. DI water rinse.
  (f) Electroplate first layer primary metal (Ni for example):
    an example of a Ni plating bath is a Barrett nickel sulfamate bath which may be obtained from:
Witco Corporation, Allied-Kelite Division Melrose Park, Ill. 60160 at the following conditions:
    T=52° C.
    pH=4.0
    40 g/l Boric acid
    80 g/l Nickel metal
    0.8 vol. % wetting agent
    Ni plate at 50 mA/sq.cm. which for 100% current efficiency will yield a plating rate of 1.0 μm/min.
(3) Rem
  (a) Blanket synchrotron expose field PMMA under the same conditions as in step (2b)
  (b) Develop PMMA using the same procedure as in step (2d)
(4) Prepare substrate for secondary metal electroplating and electroplate secondary metal:
  (a) prepare substrate as in step (2e)
  (b) electroplate secondary metal (silver, for example)
    an example of a suitable Ag bath is a silver cyanide bath which may be obtained from:
    Technic, Inc. Providence, R.I. 02940 (silver cyanide at the following conditions:
    T=35° C.
    37 g/l silver metal
    82.2 g/l free potassium cyanide
    Ag plate at 50 mA/sq.cm. which for 100% current efficiency will yield a deposition rate of 3.0 μm/min.
(5) Micromill surface of substrate to bring both first and second metals to desired height.
  an example of a milling machine which will do this is a Jung/Reichert polycut E ultramiller.
(6) Define the second level of metal:
  (a) clean surface of substrate using DI water rinses to remove metal residue left from milling;
  (b) apply adhesion promoter layer as in step (1b);
  (c) cast PMMA and anneal as in step (1c);
  (d) align second level X-ray mask to substrate using suitable alignment plates and aligner.

An example of one method is to use a double sided mask aligner (a Karl Süss 21) with two vacuum alignment plates:
  one alignment plate holds the x-ray mask on the lower stage through which the objectives image the substrate alignment marks (an optically transparent X-ray mask membrane material is used—silicon nitride for example);
  the other alignment plate holds the substrate on the upper stage;
  when alignment is achieved the two plates are mechanically clamped together, vacuum is removed, and the plates are removed and transported to the synchrotron for X-ray exposure.
(7) Electroplate second layer of primary metal:
  (a) The PMMA is X-ray exposed as in step (2b)
  (b) The substrate is prepared for second layer metal electroplating using the procedure in step (2e) with the modification that the 5% HCl dip is only 5 min.;
  (c) Electroplate second layer of primary metal—for example if Ni is used, follow the procedure in step (2f).
(8) Remove PMMA and remove sacrificial metal (Ag in this case):
  (a) remove PMMA as in step (3)
  (b) remove Ag selectively using a 1:1:12 solution of ammonium hydroxide:hydrogen peroxide:DI water.

Figure 11:
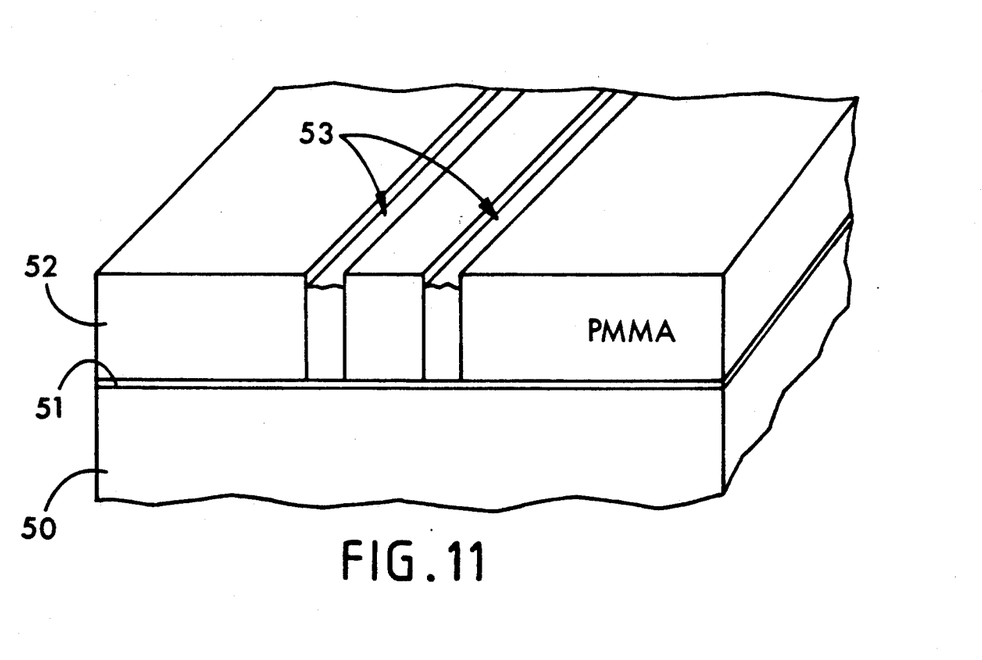
Figure 12:
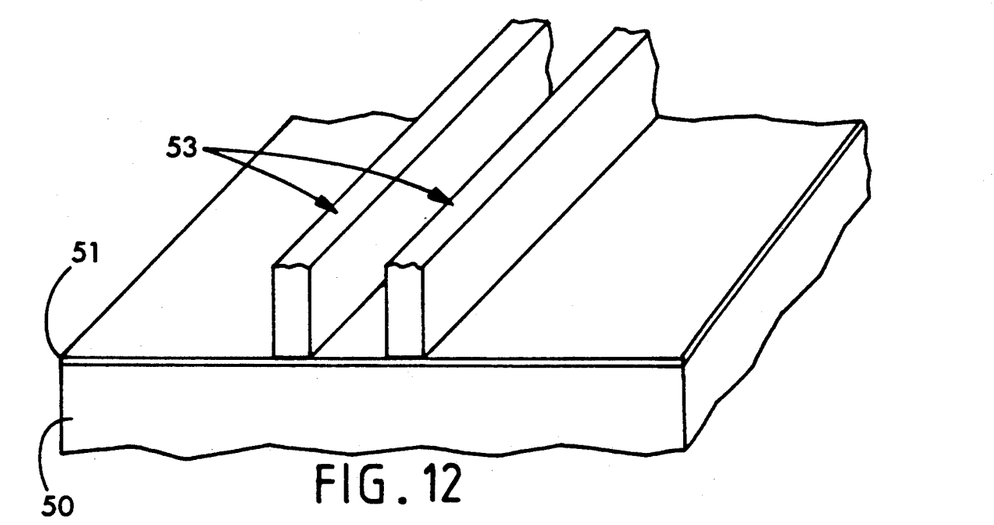

A variation of the process to produce a tube, such as that which may be utilized for pneumatics, hydraulics and so forth, is illustrated in the views of FIGS. 10–17. With reference to the initial view of FIG. 10, the starting substrate material 50 may be chosen from a large variety of materials, including silicon, glass, various metals, or processed silicon with semiconductor devices thereon which are protected from X-ray exposure. In the first step, a plating base 51 is applied (typically sputtered Ti at a thickness of 150 Å followed by sputtered Ni at 150 Å) and a layer of photoresist 52 (e.g., PMMA) which is cast to a thickness greater than the desired height of the inside of the tube. Then, in the manner described above, the photoresist is exposed to X-rays in a synchrotron, the exposed photoresist is developed, and a first layer of primary metal is electroplated into the patterned area opened by the developer, which, as illustrated in FIG. 11, may comprise two parallel vertical walls 53 which will define the side walls of the tube. The electroplating of the walls 53 is done to a height greater than the desired height of the tube. Next, as shown in FIG. 12, the photoresist is removed to leave the walls 53 isolated on the substrate.

Figure 13:
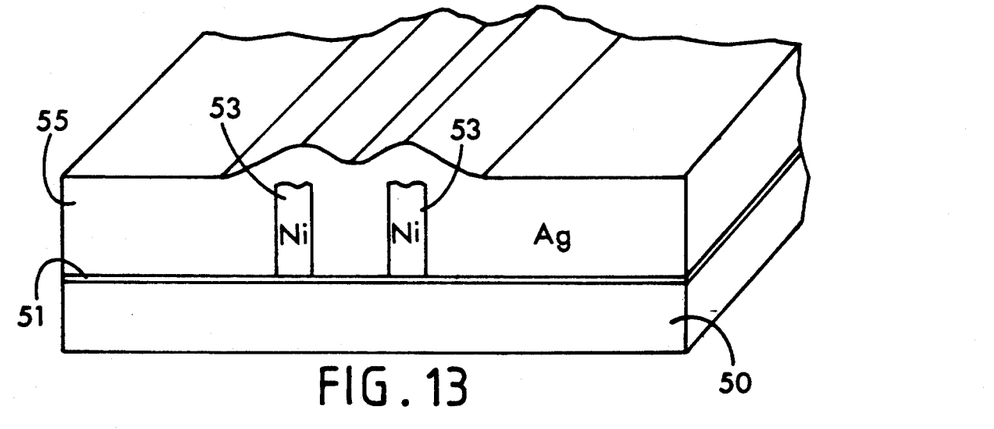
Figure 14:
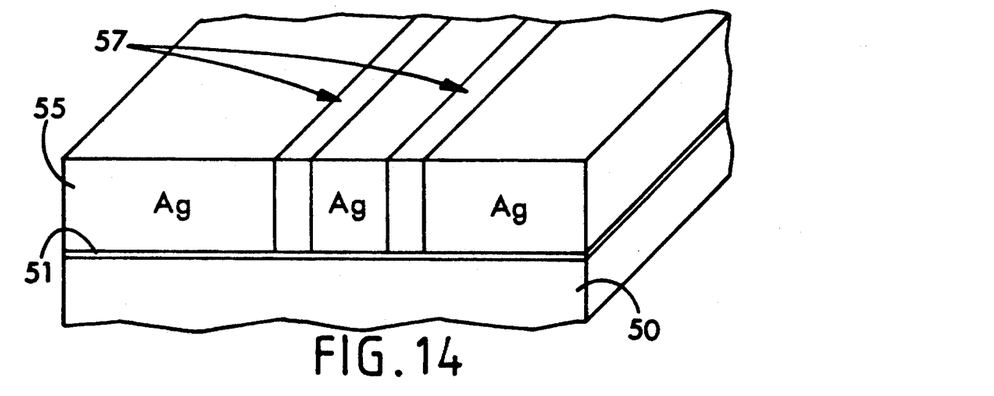

As shown in FIG. 13, the secondary metal 55 (e.g., silver) is electroplated to a thickness greater than the desired tube height, and as shown in FIG. 14, the free surface is milled down to mill both the primary and secondary metals to the desired tube height, leaving a smooth free surface 57.

Figure 15:
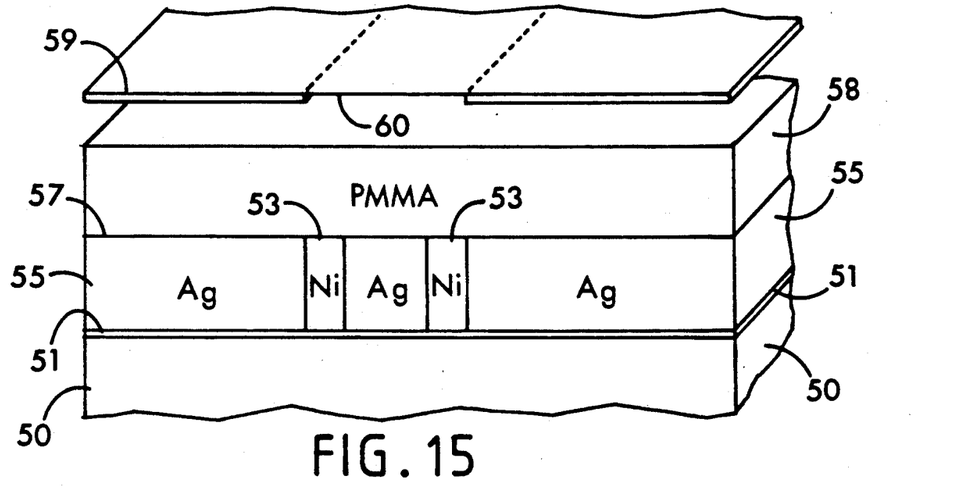
Figure 16:
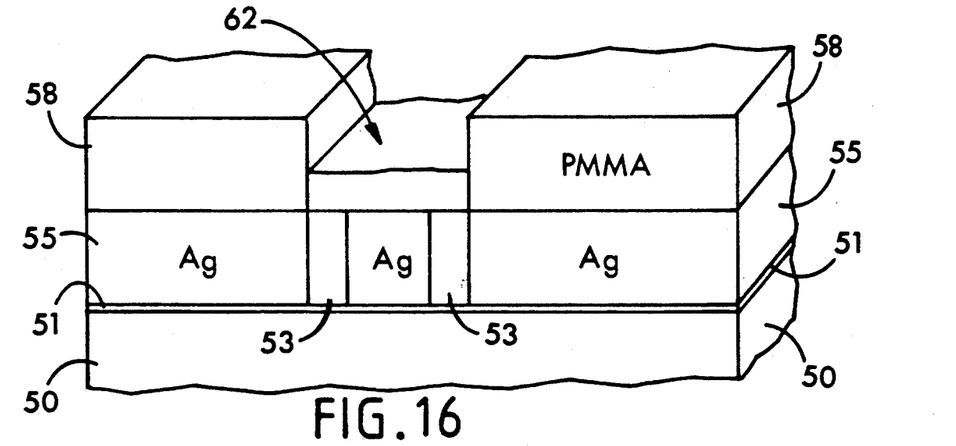

Next, as shown in FIG. 15, a second layer of photoresist 58 is cast onto the free surface 57 and an X-ray mask 59, having a pattern 60 which passes the X-rays, is aligned over the structure and an X-ray exposure is made. After exposure, as shown in FIG. 15, the exposed photoresist 58 is developed and removed, and a second layer of primary metal 62 is electroplated in the exposed area, which in this case bridges the top surfaces of the two side walls 53 as well as a center portion 61 of the first layer of the secondary metal.

Figure 17:
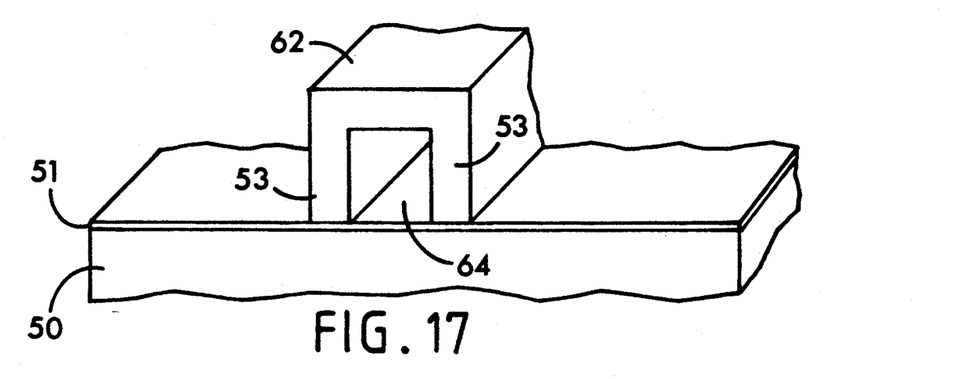

Finally, as shown in FIG. 17, the photoresist 58 is removed, and the sacrificial secondary metal layer 55 and 61 is etched away. For example, silver may be etched in hydrogen peroxide without etching nickel. The result, as shown in FIG. 17, is a tube structure fixed on the substrate which has a hollow bore 64 defined between the top surface of the plating base 51, the vertical side walls 53, and the bridging second layer 62 of the primary metal.

Figure 18:
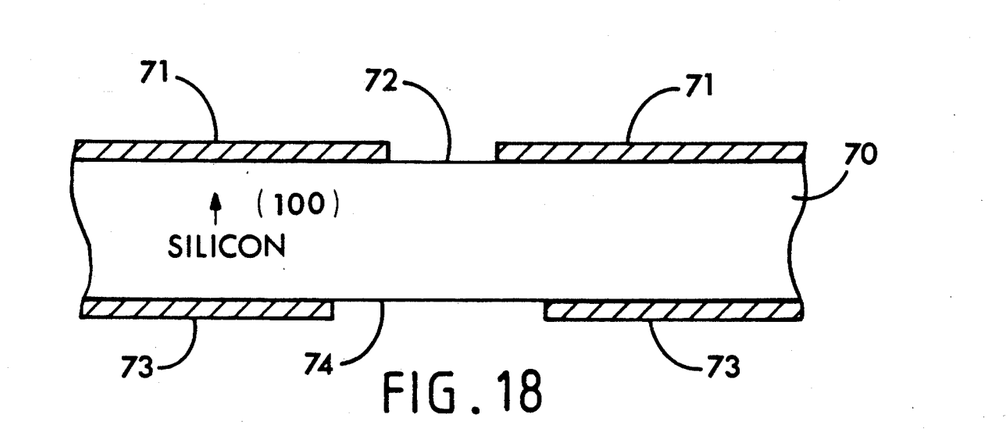
FIGS. 18-23 are schematic views illustrating steps in the process of the invention for forming a structure which can be freed from the substrate by removal of a sacrificial layer.
Figure 19:
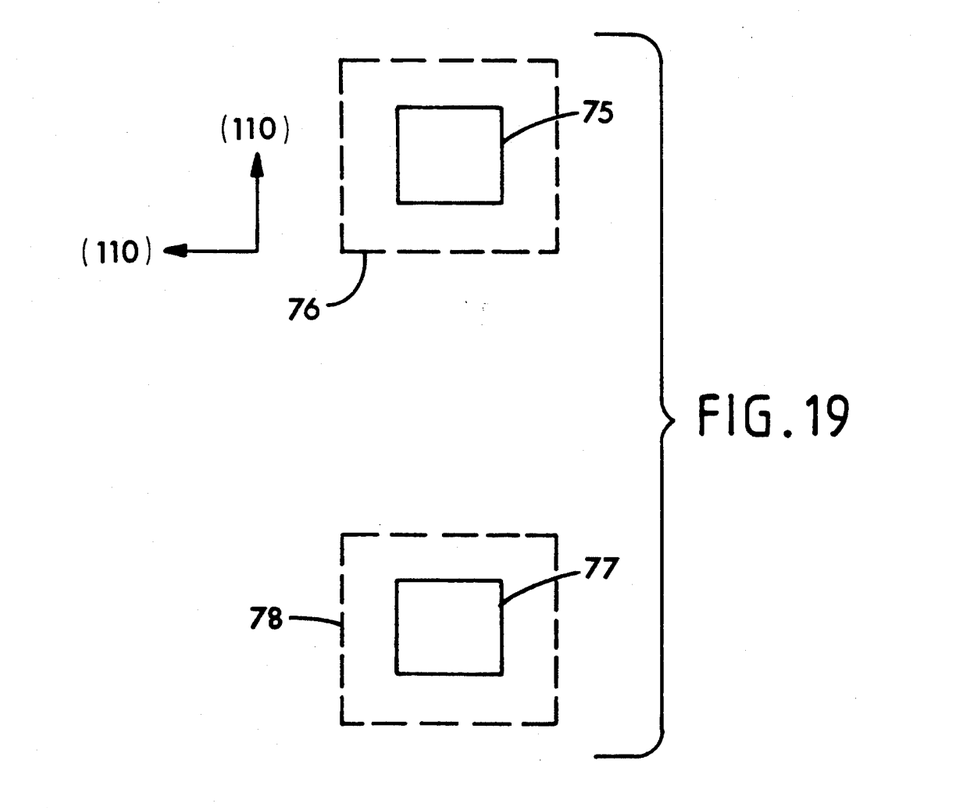
Figure 20:
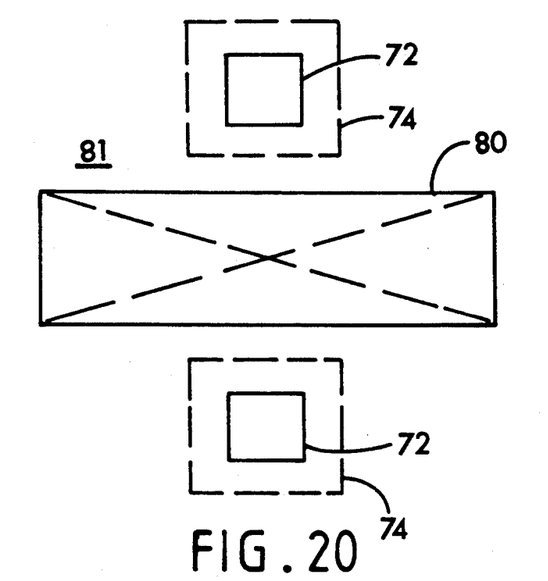

An example of the utilization of the process to produce a complex three dimensional structure, a tube, which is freed from the substrate, is illustrated in FIGS. 18-23. The initial substrate 70 may be a single crystal silicon wafer, e.g., (100) silicon. This substrate 70 is covered with a silicon nitride films 71 and 72 on each side in a conventional manner. The films 71 and 73 are patterned using two optical masks shown in FIG. 19, having illustrative front side masks 75 and 77 and back side masks 76 and 78. The result of the patterning is shown in FIG. 18, providing an opening 72 on the top surface in the silicon nitride film and an opening 74 on the bottom surface. Typical nitride processing involves a short oxidation to grow 150 Å of stress relieved oxide which is covered with 1,000 Å of low pressure chemical vapor deposition (LPCVD) nitride which is deposited at about 830° C. The two optical masks are applied in a double sided aligner and the pattern is transferred to a positive photoresist which can withstand a plasma etched in, for example, $CF_4+O_2$, to remove the nitride. A subsequent cleaning cycle will remove any oxide residues in the patterns. The process continues with the application of the sacrificial layer and its patterning via a third optical mask. The layer can be made from a variety of materials. A soft polyimide available from Brewer Science is a particularly convenient material because of its processing ease. It is preferred that the sacrificial layer (1) can be controlled in thickness accurately, (2) can be patterned accurately, (3) can support the plating base without blistering and with good adhesion, and (4) can be removed without attack on the desired metal structures. The Brewer Science PIRL polyimide material can be applied using a spin cycle of 2,000 RPM for 30 seconds to produce a 1 micron thick layer. Other PIRL formulations will change the desired layer thickness. The material is baked on a hot plate for two minutes at 100° C. and then at 210° C. for an additional minute. The film is over-coated with 1400-27 Shipley photoresist at 5000 RPM for 30 seconds. The photoresist is exposed, and developing in MF 321 (Shipley) patterns the photoresist and the polyimide. An acetone rinse removes the 1400-27 and an oxygen plasma cycle cleans the prepared surface. A final bake-out with a 240°/hour ramp in nitrogen and a 6 min. soak at 310° C. completes the sacrificial layer, which is illustrated in FIG. 20 at 80 on the surface 81 of the substrate.

The process continues with the application of the plating base. The plating base has several required attributes, among which are (1) good adhesion to the substrate and to the sacrificial layer, (2) good adhesion between the electroplated metals, and (3) easy removal after the completion of the primary metal structure. A generally satisfactory plating base for nickel consists of 150 Å of sputtered titanium followed by 150 Å of sputtered nickel.

The unpatterned plating base is next coated by an adhesion promoter which is applied by spin coating to improve adhesion between the plating base and the X-ray photoresist, typically PMMA. This material is cast and allowed to cross-link mildly. It is cured and annealed very carefully with slow heat ramps and soaks to 180° C. Since the thickness of the deposited photoresist (e.g., PMMA) is difficult to control, if desired, diamond milling of the photoresist may be utilized.

Figure 21:
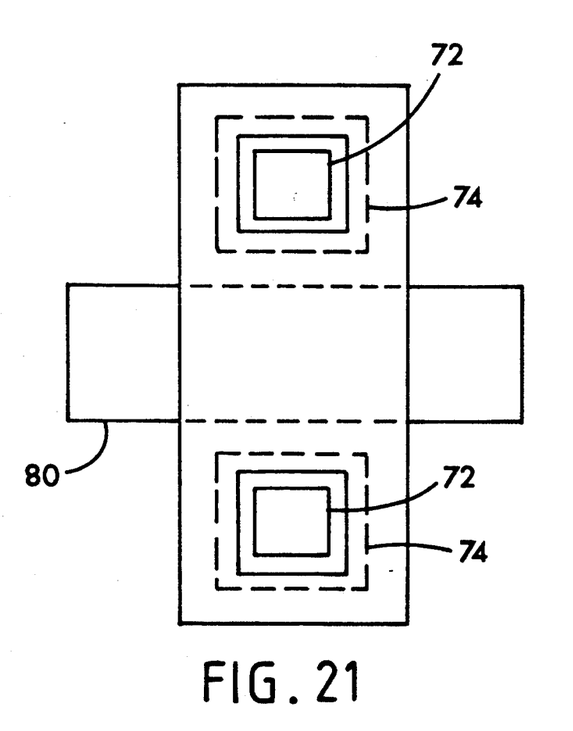

The photoresist coated substrate is next aligned to a first X-ray mask. This alignment is accomplished by using a Karl Süss double sided aligner together with aligning and clamping fixtures. After alignment, the substrate and mask are clamped together, transported to a synchrotron and exposed. Development in a PMMA developer follows. A mild oxygen plasma etch is used for residue removal and is followed by critical conditioning of the exposed plating base in dilute hydrochloric acid. Nickel plating in a sulfamate bath is the next step. The second exposure, followed by developing and cleaning is used to remove the photoresist. FIG. 21 is a top view of the structure at this stage.

The following considerations may be noted for further steps in the process. First, cross-linked PMMA is very difficult to remove by wet chemistry. This implies that cross-linked PMMA is a poor sacrificial layer. Second, the X-ray photoresist after plating is damaged mechanically. Typically it is crazed and cracked, and adhesion loss due to stress relaxation and heat cycles is typical. The material usually cannot be processed further. Third, electroplating at several microns per minute does not produce an environment in which the height of the structure is controllable. This difficulty in controlling the height is further complicated by pattern dependent deposition rates and rough surface finishes. Fourth, topological restrictions are removed if the substrate can be made to act as a new, planar plating base.

Figure 22:
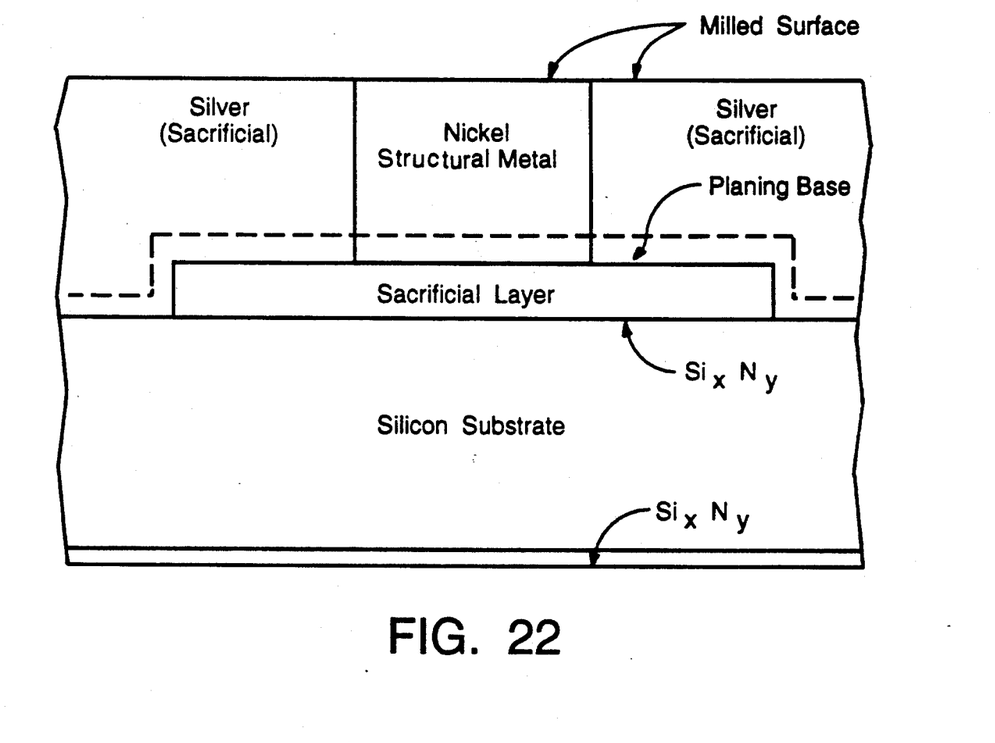

To address the problems noted above, the entire substrate can be electroplated with a sacrificial metal. The sacrificial or secondary metal thickness should exceed the structural or primary metal thickness. This plating will produce a surface with undulations which are roughly equal to the thickness of the primary metal. This surface undulation is eliminated by milling the electroplated surface down with a micromill, for example, a diamond fly cutter such as the Jung-Reichart ultramiller. FIG. 22 shows the cross-section through the structure of FIG. 21.

At this point, the structure is a magnetic and nonmagnetic metal composite material with a flat surface which can have several applications, including magnetic reading and writing heads.

The process continues with the application of the next layer of photoresist and alignment to a second X-ray mask. The second structural or primary metal layer is then electroplated after development of the exposed photoresist. The second layer of primary metal may be nickel, but, of course, could be some other conductor. Photoresist removal is followed by secondary metal plating and milling.

Figure 23:
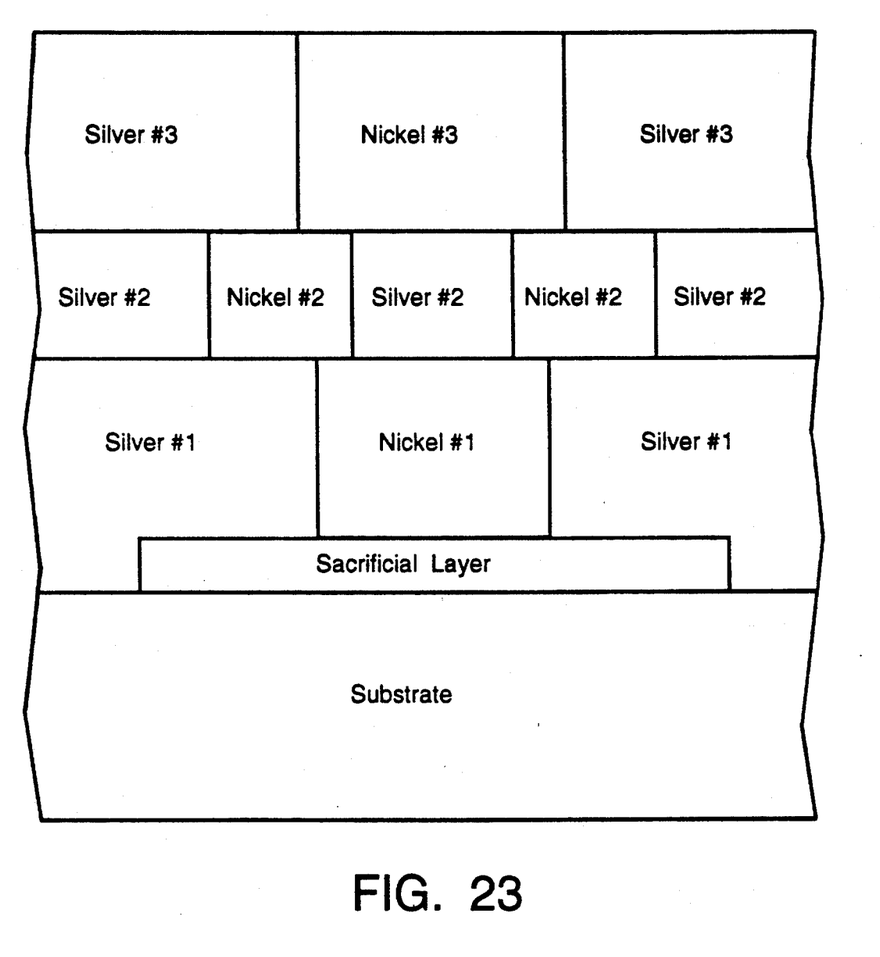

A third X-ray mask and subsequent processing as described above is used to produce the complete tube which is illustrated in the cross-sectional view of FIG. 23.

Next, silicon etch holes may be formed. The wafer is immersed in hydrazine or EDP, and the via holes are etched by using the customary (111) planes to stop the etch. The silicon etch limits on these planes and the plating base. The plating base in the via holes is removed by hydrochloric acid etching, which is followed by a dilute hydrofluoric rinse to remove the titanium.

Silver etches in $H_2O:H_2O_2:NH_4OH$ mixtures. Such an etchant is used to remove all external and internal secondary metal.

The next step removes all exposed plating base. This uncovers the sacrificial layer which is then removed with ammonium hydroxide.

The resulting device is an open, partially supported nickel tube. It can be utilized as a basic component in the production of pneumatic and hydraulic sensor and actuator systems.

It is understood that the invention is not confined to the embodiments set forth herein as illustrative, but embraces such modified forms thereof as come within the scope of the following claims.

What is claimed is:

1. A method of forming micromechanical structures comprising the steps of:
    (a) providing a plating base on a surface of a substrate;
    (b) applying a photoresist in a layer onto the plating base;
    (c) exposing the photoresist in a pattern to radiation to render the photoresist dissolvable in a pattern;
    (d) removing the dissolvable photoresist;
    (e) electroplating a first layer of a primary metal onto the plating base in the area from which the photoresist has been removed;
    (f) removing the remainder of the photoresist;
    (g) electroplating a first layer of a secondary metal onto the plating base to cover and surround the first layer of the primary metal, the secondary metal chosen so that it can be differentially etched without substantially etching the primary metal;
    (h) machining the exposed surface of the secondary metal down to a flat surface to a selected height which exposes the first layer of the primary metal.

2. The method of claim 1 including the further step of applying an etchant to the primary and secondary metals which etches the secondary metal while substantially not etching the primary metal to remove the secondary metal.

3. The method of claim 1 wherein the secondary metal is electroplated to a height greater than the height of first layer of primary metal.

4. The method of claim 1 including the further steps of:
    (a) applying a photoresist in a layer over the exposed first layer of primary metal and the secondary metal;
    (b) exposing the photoresist to radiation in a pattern to render the photoresist dissolvable in a pattern;
    (c) removing the dissolvable photoresist;
    (d) electroplating a second layer of a primary metal in the area from which the photoresist has been removed to cover at least part of the exposed surface of the first layer of primary metal and to also cover part of the exposed surface of the first layer of secondary metal;
    (e) removing the remainder of the photoresist;
    (f) electroplating a second layer of a secondary metal over the second layer of the primary metal and over the surface of the first layer of the primary and secondary metals;
    (g) machining the exposed surface of the second layer of the secondary metal down to a flat surface to a height which exposes the second layer of the primary metal.

5. The method of claim 4 including the additional step of applying an etchant to the surface of the second layers of the primary and secondary metals to differentially etch away the first and second layers of the secondary metal while substantially not etching the first and second layers of the primary metal.

6. The method of claim 4 wherein the second layer of secondary metal is deposited to a height which is greater than the height of the second layer of primary metal.

7. The method of claim 1 wherein the step of exposing the photoresist in a pattern is carried out by exposing the photoresist to X-ray synchrotron radiation through an X-ray mask to define a pattern in the photoresist and wherein the photoresist is sensitive to X-rays to be dissolvable after exposure to X-rays.

8. The method of claim 7 wherein the photoresist is polymethylmethacrylate.

9. The method of claim 1 wherein the primary metal is nickel and the secondary metal is silver.

10. The method of claim 1 wherein the step of machining is carried out utilizing a micromill.

11. The method of claim 1 wherein in the step of exposing the photoresist in a pattern the photoresist is exposed to provide two parallel areas where the photoresist can be dissolved, and wherein the electroplated primary metal formed in the area where the photoresist has been dissolved defines two parallel upright walls extending from the plating base.

12. The method of claim 11 including the further steps of:
    (a) applying a photoresist in a layer over the exposed first layer of primary metal and the first layer of secondary metal;
    (b) exposing the photoresist to radiation in a pattern to render the photoresist dissolvable in the pattern which extends across the two upright walls defined by the first layer of primary metal;
    (c) removing the dissolvable photoresist;
    (d) electroplating a second layer of primary metal in the area from which the photoresist has been removed to cover the exposed surface of the first layers of metal and to bridge the exposed surface of the secondary metal between the two upright walls formed by the first layer of primary metal;
    (e) removing the remainder of the photoresist;
    secondary metals to differentially etch away the first layer of the secondary metal while substantially not etching the first and second layers of the primary metal.

13. The method of claim 1 wherein the substrate includes a layer of sacrificial material onto which the plating base is applied, and including the additional step after all other steps have been completed of removing the plating base in selected areas to provide access to the sacrificial layer material and applying an etchant which etches the sacrificial layer without substantially etching the primary metal.

14. A method of forming micromechanical structures comprising the steps of:
    (a) providing a plating base on a surface of a substrate;
    (b) applying a photoresist in a layer onto the plating base;
    (c) exposing the photoresist in a pattern to radiation to render the photoresist dissolvable in a pattern;

(d) removing the dissolvable photoresist;
(e) electroplating a first layer of a primary metal onto the plating base in the area from which the photoresist has been removed;
(f) removing the remainder of the photoresist;
(g) electroplating a first layer of a secondary metal onto the plating base to cover and surround the first layer of the primary metal, the secondary metal chosen so that it can be differentially etched without substantially etching the primary metal;
(h) machining the exposed surface of the secondary metal down to a flat surface to a selected height which exposes the first layer of the primary metal;
(i) applying a photoresist in a layer over the exposed first layer of primary metal and the first layer of secondary metal;
(j) exposing the photoresist to radiation in a pattern to render the photoresist dissolvable in a pattern;
(k) removing the dissolvable photoresist;
(l) electroplating a second layer of a primary metal in the area from which the photoresist has been removed to cover at least part of the exposed surface of the first layer of primary metal and to also cover part of the exposed surface of the first layer of secondary metal;
(m) removing the remainder of the photoresist;
(n) electroplating a second layer of a secondary metal over the second layer of the primary metal and over the surface of the first layer of the primary and secondary metals; and surface to a height which exposes the second layer of the primary metal.

15. The method of claim 14 wherein in the steps of electroplating the first and second layers of secondary metal, the secondary metal is electroplated to a height which is greater than the height of the layer of primary metal.

16. The method of claim 14 including the additional step of applying an etchant to the surface of the second layers of the primary and secondary metals to differentially etch away the first and second layers of the secondary metal while substantially not etching the first and second layers of the primary metal.

17. The method of claim 14 wherein the step of exposing the photoresist in a pattern is carried out by exposing the photoresist to X-ray synchrotron radiation through an X-ray mask to define a pattern in the photoresist and wherein the photoresist is sensitive to X-rays to be dissolvable after exposure to X-rays.

18. The method of claim 17 wherein the photoresist is polymethylmethacrylate.

19. The method of claim 14 wherein the primary metal is nickel and the secondary metal is silver.

20. The method of claim 14 wherein the step of machining is carried out utilizing a micromill.

21. The method of claim 14 wherein the substrate includes a layer of sacrificial material onto which the plating base is applied, and including the additional step after all other steps have been completed of removing the plating base in selected areas to provide access to the sacrificial layer and applying an etchant which etches the sacrificial layer without substantially etching the primary metal.

* * * * *

UNITED STATES PATENT AND TRADEMARK OFFICE
CERTIFICATE OF CORRECTION

PATENT NO. : 5,190,637
DATED : March 2, 1993
INVENTOR(S) : Henry Guckel It is certified that error appears in the above-identified patent and that said Letters Patent is hereby corrected as shown below:

Column 7, line 39, "(3) Rem" should be --(3) Remove field PMMA:--.

Column 7, line 51, after "cyanide" add --bath E-2)--.

Column 12, line 42, after "layer of" add --a--.

Column 12, line 49, before "secondary" add --(f) applying an etchant to the primary and--.

Signed and Sealed this

First Day of March, 1994

Attest:

BRUCE LEHMAN

*Attesting Officer*  Commissioner of Patents and Trademarks